United States Patent
Madhuranthakam et al.

(10) Patent No.: US 9,063,206 B2
(45) Date of Patent: Jun. 23, 2015

(54) SYSTEM AND METHOD FOR DOUBLE INVERSION RECOVERY FOR REDUCTION OF $T_1$ CONTRIBUTION TO FLUID-ATTENUATED INVERSION RECOVERY IMAGING

(75) Inventors: Ananth J. Madhuranthakam, Coppell, TX (US); David C. Alsop, Newton, MA (US)

(73) Assignees: General Electric Company, Schenectady, NY (US); Beth Israel Deaconess Medical Center, Boston, MA (US)

( * ) Notice: Subject to any disclaimer, the term of this patent is extended or adjusted under 35 U.S.C. 154(b) by 625 days.

(21) Appl. No.: 13/427,394

(22) Filed: Mar. 22, 2012

(65) Prior Publication Data

US 2012/0262169 A1    Oct. 18, 2012

Related U.S. Application Data

(60) Provisional application No. 61/476,605, filed on Apr. 18, 2011.

(51) Int. Cl.
  *G01V 3/00*  (2006.01)
  *G01R 33/56*  (2006.01)
  *G01R 33/46*  (2006.01)

(52) U.S. Cl.
  CPC ........ *G01R 33/5602* (2013.01); *G01R 33/4616* (2013.01); *G01R 33/5607* (2013.01)

(58) Field of Classification Search
  CPC .................................................. G01R 33/4616
  USPC .................................. 324/307, 309, 312, 314
  See application file for complete search history.

(56) References Cited

U.S. PATENT DOCUMENTS 5,528,144 A    6/1996    Gullapalli et al.
6,288,543 B1    9/2001    Listerud et al.
(Continued)

FOREIGN PATENT DOCUMENTS

EP    0075956 A1    4/1983

OTHER PUBLICATIONS

Madhuranthakam et al., "Optimized Double Inversion Recovery for Reduction of T1 Weighting in Fluid-Attenuated Inversion Recovery," Magnetic Resonance in Medicine, vol. 67, pp. 81-88, 2012.
(Continued)

*Primary Examiner* — Louis Arana
(74) *Attorney, Agent, or Firm* — Ziolkowski Patent Solutions Group, SC (57) ABSTRACT

A system and method for double inversion recovery for reduction of T1 contribution to fluid-attenuated inversion recovery imaging include a computer programmed to prepare a double inversion recovery (DIR) sequence comprising a pair of inversion pulses and an excitation pulse, execute the DIR sequence to acquire MR data from an imaging subject, and reconstruct an image based on the acquired MR data. The preparation of the DIR sequence comprises optimizing a first inversion time ($TI_1$) between the pair of inversion pulses and a second inversion time ($TI_2$) between one of the pair of inversion pulses and the excitation pulse to cause a first tissue of the imaging subject to be suppressed in the image and to reduce a T1 contrast between a second tissue and a third tissue of the imaging subject in the image.

20 Claims, 3 Drawing Sheets

(56) References Cited

U.S. PATENT DOCUMENTS

| | | | |
|---|---|---|---|
| 7,315,756 B2 * | 1/2008 | Yarnykh et al. | 600/411 |
| 7,369,887 B2 * | 5/2008 | Fayad et al. | 600/413 |
| 8,311,612 B2 * | 11/2012 | Rehwald et al. | 600/420 |
| 8,704,518 B2 * | 4/2014 | Alsop et al. | 324/314 |

OTHER PUBLICATIONS

Hajnal et al., "High Signal Regions in Normal White Matter Shown by Heavily T2-Weighted CSF Nulled IR Sequences," Journal of Computer Assisted Tomography, vol. 16, No. 4, pp. 506-513, Jul./Aug. 1992.

Redpath et al., Technical note: Use of a double inversion recovery pulse sequence to image selectively grey or white brain matter, The British Journal of Radiology, vol. 67, No. 804, pp. 1258-1263, 1994.

Rydberg et al., "Contrast Optimization of Fluid-Attenuated Inversion Recovery (FLAIR) Imaging," MRM, vol. 34, pp. 868-877, 1995.

* cited by examiner

SYSTEM AND METHOD FOR DOUBLE INVERSION RECOVERY FOR REDUCTION OF $T_1$ CONTRIBUTION TO FLUID-ATTENUATED INVERSION RECOVERY IMAGING

CROSS-REFERENCE TO RELATED APPLICATION

The present application is a non-provisional of, and claims priority to, U.S. Provisional Patent Application Ser. No. 61/476,605, filed Apr. 18, 2011, the disclosure of which is incorporated herein by reference.

BACKGROUND OF THE INVENTION

Embodiments of the invention relate generally to fluid-attenuated inversion recovery (FLAIR) imaging and, more particularly, to a system and method for reducing the $T_1$ contribution to FLAIR imaging.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals is digitized and processed to reconstruct the image using one of many well known reconstruction techniques.

$T_2$-weighted contrast is routinely used in current clinical practice for brain MR imaging. It aids in the diagnosis of diseases that have lesions with prolonged $T_2$ compared to its surrounding tissues. Lesions frequently appear in white matter (WM) or gray matter (GM) adjacent to cerebrospinal fluid (CSF). In such cases, the lesions may be obscured by the bright signal of CSF on $T_2$-weighted images. To improve the conspicuity of these lesions, fluid-attenuated inversion recovery (FLAIR) is commonly used to suppress CSF. However, the inversion recovery (IR) pulse used in FLAIR typically imparts $T_1$ weighting that can decrease detectability and may lead to mischaracterization of some lesions. For example, FLAIR imaging provides highest sensitivity in the detection of lesions close to CSF such as the juxta-cortical and periventricular WM but is less sensitive in the posterior fossa. Frequently, both pure $T_2$ and FLAIR images are acquired in clinical protocols.

$T_1$ weighting is unavoidable in FLAIR. The IR pulse in the FLAIR sequence inverts the longitudinal magnetization ($M_z$) of all tissues, which then recover to their equilibrium magnetization ($M_0$) based on their longitudinal relaxation times ($T_1$). Due to the prolonged $T_1$ of lesions compared to their surrounding tissue, lesions have reduced $M_z$ compared with normal tissue at the time of excitation. This forces the use of long echo time (TE) to establish the $T_2$-weighted contrast required to detect the long $T_2$ lesions. Additionally, the $T_1$ weighting is more pronounced at shorter repetition times (TR). It has been previously emphasized that long TRs and long TEs with FLAIR are preferable for detection of multiple sclerosis (MS) lesions.

Double IR (DIR) preparations allow the highlighting of certain types of brain lesions. The two IR pulses in a typical DIR preparation are timed to suppress two different types of tissues, for example, WM and CSF. While this produces an image with high contrast between WM and lesion, the contrast is entirely due to the $T_1$ differences. Thus, DIR images produce even stronger $T_1$ contrast than FLAIR.

It would therefore be desirable to have a system and method capable of minimizing $T_1$ weighting and of producing images with pure $T_2$ weighting over the range of $T_1$s typical of brain tissue, white simultaneously suppressing CSF.

BRIEF DESCRIPTION OF THE INVENTION

In accordance with one aspect of the invention, an MRI apparatus comprises a magnetic resonance imaging (MRI) system having a plurality of gradient coils positioned about a bore of a magnet, and an RF transceiver system and an RF switch controlled by a pulse module to transmit RF signals to an RF coil assembly to acquire MR images. A computer is also included and programmed to prepare a double inversion recovery (DIR) sequence comprising a pair of inversion pulses and an excitation pulse, execute the DIR sequence to acquire MR data from an imaging subject, and reconstruct an image based on the acquired MR data. The preparation of the DIR sequence comprises optimizing a first inversion time ($TI_1$) between the pair of inversion pulses and a second inversion time ($TI_2$) between one of the pair of inversion pulses and the excitation pulse to cause a first tissue of the imaging subject to be suppressed in the image and to reduce a T1 contrast between a second tissue and a third tissue of the imaging subject in the image.

In accordance with another aspect of the invention, a method of MR imaging comprises preparing a double inversion recovery (DIR) sequence comprising a pair of inversion pulses and an excitation pulse that optimizes a first inversion time ($TI_1$) and a second inversion time ($TI_2$) to cause suppression of MR signals of a first tissue of an imaging subject and to reduce a T1 contrast between MR signals of a second tissue and a third tissue of the imaging subject, wherein $TI_1$ occurs between the inversion pulses of the pair of inversion pulses and wherein $TI_2$ occurs between the pair of inversion pulses and the excitation pulse. The method also includes executing the DIR sequence to acquire MR data from the imaging subject, and reconstructing an image based on the acquired MR data.

In accordance with yet another aspect of the invention, a computer readable storage medium having stored thereon a computer program comprising instructions, which, when executed by a computer, cause the computer to prepare a double inversion recovery (DIR) sequence comprising a first inversion pulse, a second inversion pulse, and an excitation pulse executable after the first and second pulses, wherein a timing between the first and second pulses and a timing between the second pulse and the excitation pulse cause suppression of a first tissue in an image reconstructed from data acquired from an imaging subject and cause a reduction in a T1 contrast between a second tissue and a third tissue of the imaging subject in the image. The instructions also cause the computer to execute the DIR sequence to acquire MR data from the imaging subject, and reconstruct the image based on the acquired MR data.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

Figure 1:
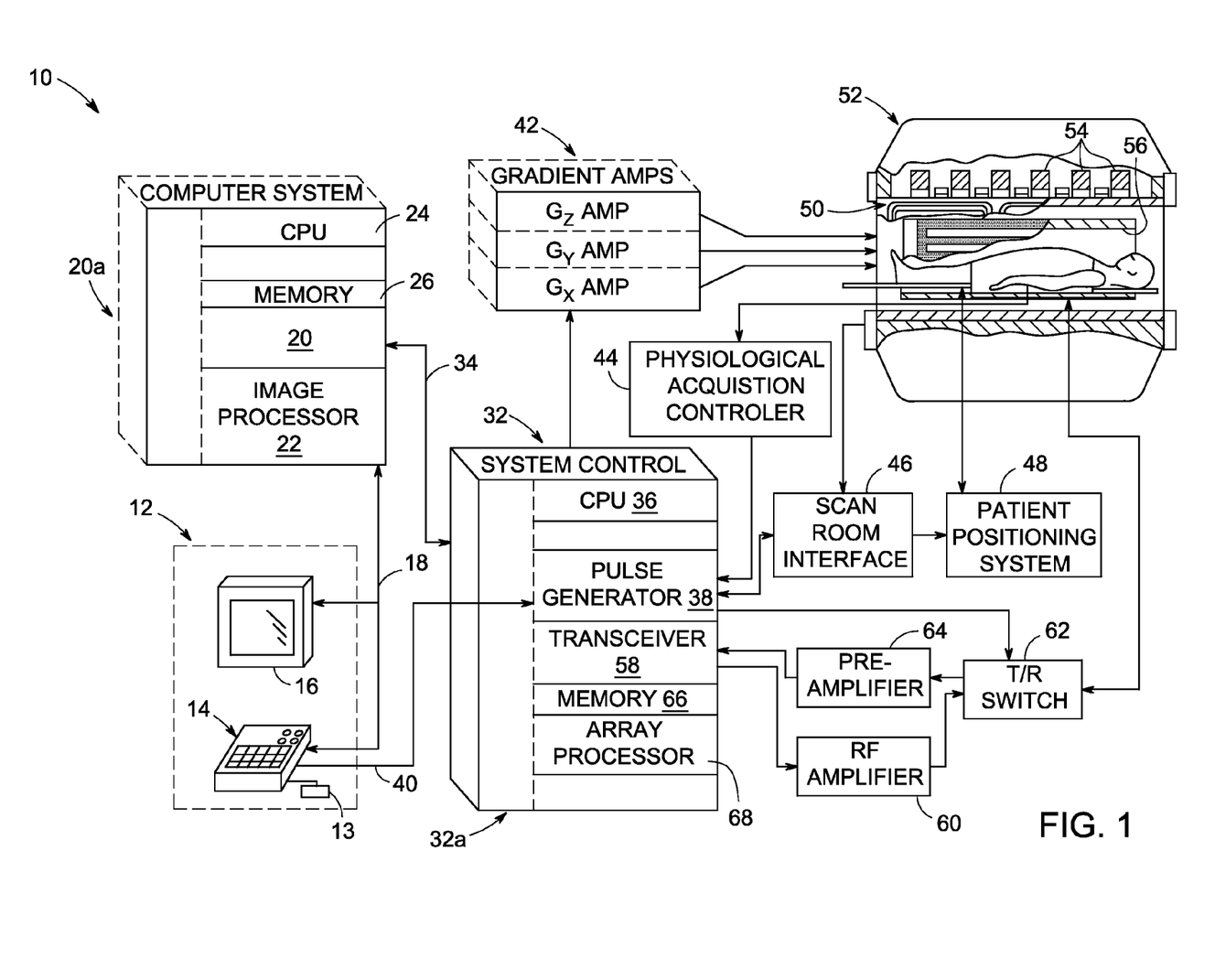
FIG. 1 is a schematic block diagram of an exemplary MR imaging system for use with an embodiment of the invention.

Referring to FIG. 1, the major components of a magnetic resonance imaging (MRI) system 10 incorporating an embodiment of the invention are shown. The operation of the system is controlled for certain functions from an operator console 12 which in this example includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These modules include an image processor module 22, a CPU module 24 and a memory module 26, known in the art as a frame buffer for storing image data arrays. The computer system 20 communicates with a separate system control 32 through a high speed serial link 34. The input device 13 can include a mouse, joystick, keyboard, track ball, touch activated screen, light wand, voice control, card reader, push-button, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a resonance assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12 or as otherwise directed by the system software, this image data may be archived in long term storage or it may be further processed by the image processor 22 and conveyed to the operator console 12 and presented on the display 16.

Figure 2:
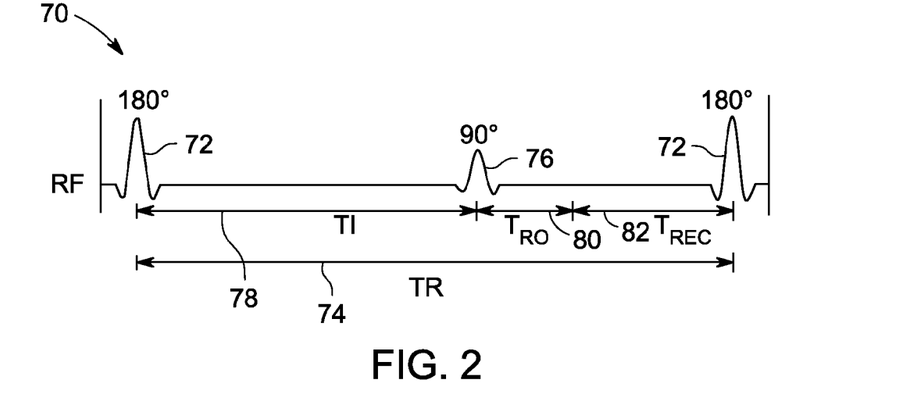
FIG. 2 is a pulse sequence showing a single inversion recovery fluid-attenuated inversion recovery (FLAIR) sequence.

FIG. 2 shows a pulse diagram of a fluid-attenuated inversion recovery (FLAW) sequence 70 according to an embodiment of the invention. An inversion recovery (IR) pulse 72 is applied for each repetition time (TR) 74, followed by an excitation pulse 76 after an inversion time 78 of TI. Later, the data are acquired for a readout period ($T_{RO}$) 80, followed by a recovery time 82. The measured signal in FLAIR for a given material with $T_1$ and $T_2$ is given by:

$$S = M_0 \left[ 1 - 2e^{\frac{-TI}{T_1}} + e^{\frac{-(TR-T_{RO})}{T_1}} \right] \cdot e^{-TE_{eff}/T_2}, \qquad \text{Eqn. (1)}$$

where $TE_{eff}$ is the effective echo time.

Figure 3:
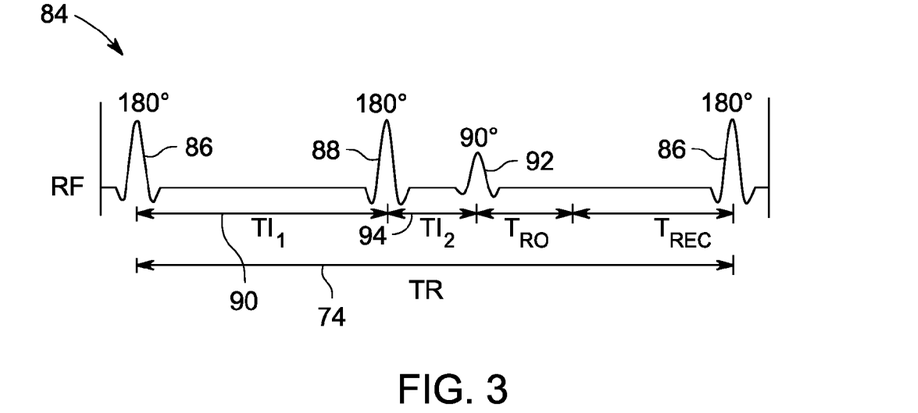
FIG. 3 is a pulse sequence showing a dual inversion recovery FLAIR sequence according to an embodiment of the invention.

FIG. 3 shows a pulse diagram of a double inversion recovery (DIR) sequence 84. As shown, two IR pulses 86, 88 are applied during DIR sequence 84. The time interval between IR pulses 86, 88 is defined by the inversion time 90 of $TI_1$ and the time interval between $TI_1$ and excitation pulse 92 is defined by the inversion time 94 of $TI_2$. The measured signal in DM for a given material with $T_1$ and $T_2$ is given by:

$$S = M_0 \left[ 1 - 2e^{\frac{-TI_2}{T_1}} + 2e^{\frac{-(TI_1+TI_2)}{T_1}} - e^{\frac{-(TR-T_{RO})}{T_1}} \right] \cdot e^{-TE_{eff}/T_2}, \qquad \text{Eqn. (2)}$$

where $TE_{eff}$ is the effective echo time.

While the inversion times 90, 94 in DIR sequence 84 can be varied to achieve various goals such as, for example, the suppression of both CSF and WM, embodiments of the invention optimize inversion times 90, 94 to suppress a first tissue (e.g., CSF) and to reduce or eliminate $T_1$ contrast between two other tissues (e.g., WM and MS lesion) at the time of excitation.

Figure 4:
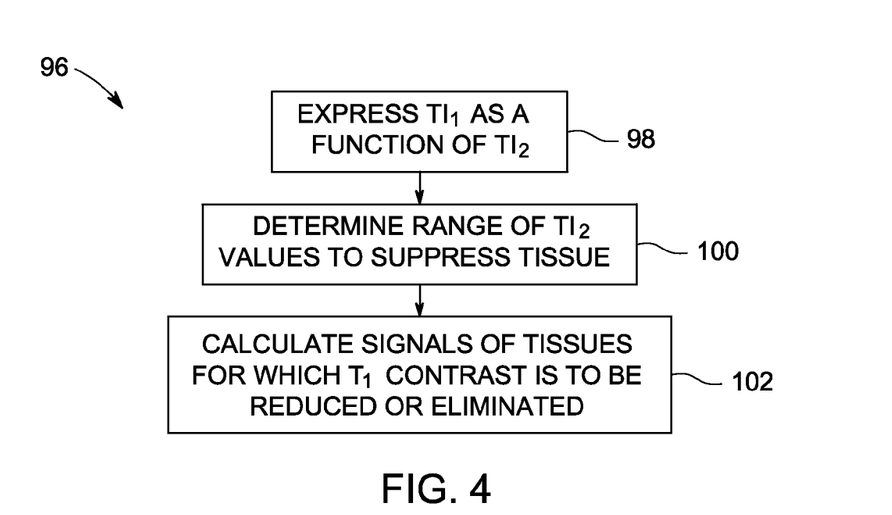
FIG. 4 is a flowchart illustrating a technique for optimizing inversion times of the DIR sequence of FIG. 3 according to an embodiment of the invention.

FIG. 4 illustrates a flowchart of a technique 96 for optimizing inversion times of a DIR sequence such as sequence 84 according to an embodiment of the invention. At block 98, $TI_1$ is expressed as a function of $TI_2$ by setting the DIR signal of the tissue to be nulled to zero in the equation:

$$TI_1 = T_1 \ln\left( \frac{2}{2e^{-TI_2/T_1} + e^{-(TR-T_{RO})/T_1} - 1} \right) - TI_2, \qquad \text{Eqn. (3)}$$

where $T_1$ corresponds to the tissue to be nulled (e.g., $T_{1CSF}$).

At block 100, the range of $TI_2$ values that suppresses the tissue to be nulled is determined. That is, one or more pairs of ($TI_1$,$TI_2$) values may be determined to null the desired tissue. The range of $TI_2$ values varies from zero to a certain maximum value, $TI_2^{max}$, at which the summation of $TI_1$ and $TI_2$ equals TR. $TI_2^{max}$ is determined from Eqn. 3 by substituting $TI_2$ with (TR-$TI_1$):

$$TI_2^{max} = T_1 \ln\left( \frac{2}{1 + 2e^{-TR/T_1} - e^{-(TR-T_{RO})/T_1}} \right), \qquad \text{Eqn. (4)}$$

where $T_1$ corresponds to the tissue to be nulled (e.g., $T_{1CSF}$).

At block 102, using Eqn. 2, the signals, S, for two tissues for which the $T_1$ contrast is to be reduced or eliminated are calculated using $TE_{eff}=0$. Using CSF, WM and MS lesion tissues as examples according to an embodiment, for each pair of ($TI_1$,$TI_2$) that nulls CSF, the signals for WM ($S_{WM}$) and MS lesion ($S_{MS}$) at the time of excitation (e.g., $TI_1$,+$TI_2$) are calculated according to Eqn. 2 using $TE_{eff}=0$. The $TI_1$,$TI_2$) pair at which $S_{WM}$ and $S_{MS}$ are equal or substantially equal provides the inversion times where the $T_1$ contrast between WM and MS lesion is reduced or eliminated. Excitation after preparation with this DIR timing provides the same transverse magnetization for both WM and MS lesion.

Figure 5:
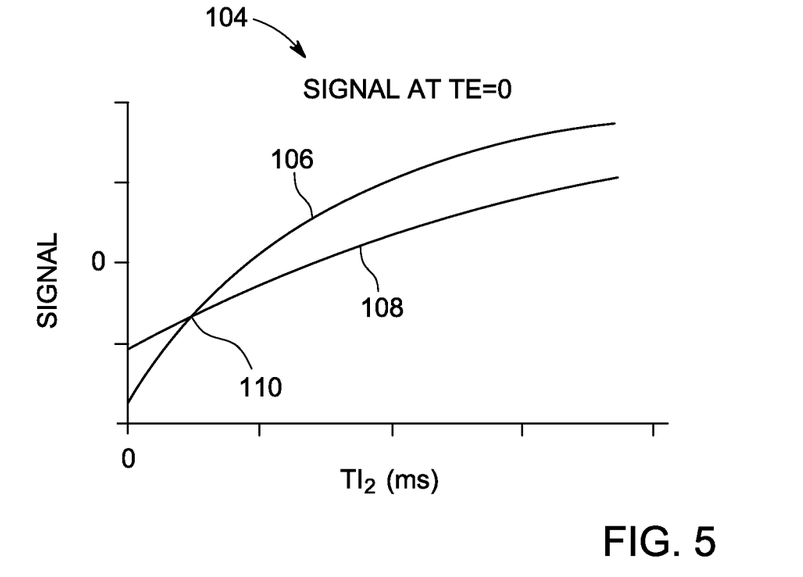
FIG. 5 is a plot showing signals for a pair of tissues for which the $T_1$ contrast is to be reduced or eliminated according to an embodiment of the invention.

FIG. 5 illustrates a plot 104 at $TE_{eff}=0$ of a pair of tissues 106, 108 (e.g., WM and MS lesion) for which the $T_1$ contrast is to be reduced or eliminated according to an embodiment of the invention. At a crossing point 110 of the tissue signals 106, 108, the tissue to be nulled is substantially suppressed, and the $T_1$ contrast between the tissues 106, 108 is substantially reduced or eliminated. Note that the longitudinal magnetization of the tissues 106, 108 at the time of excitation may be negative as shown.

Figure 6:
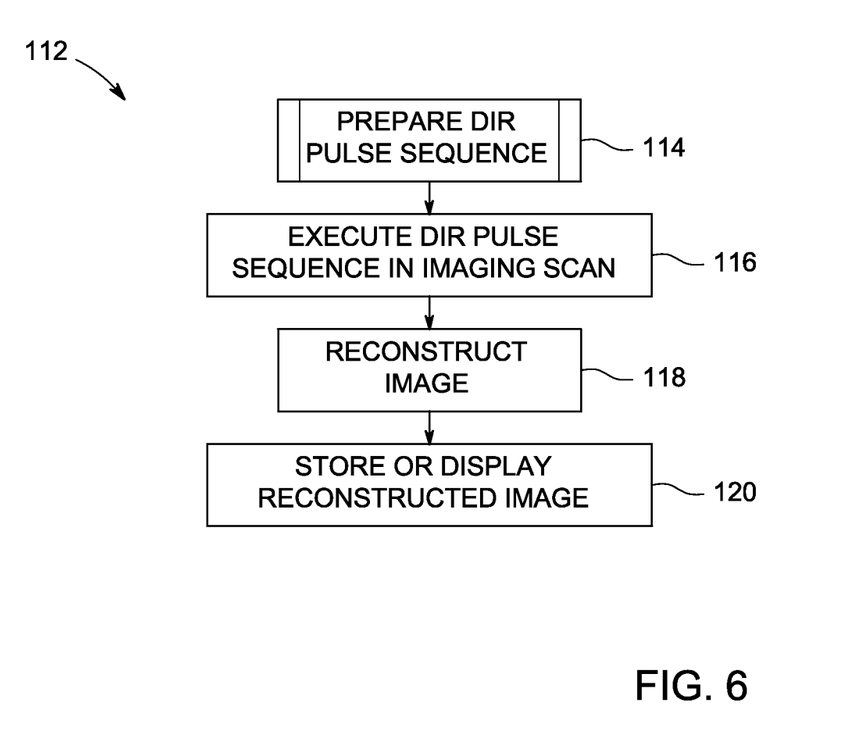
FIG. 6 is a flowchart illustrating a technique for optimizing inversion times of the DIR sequence of FIG. 3 according to an embodiment of the invention.

FIG. 6 illustrates a flowchart of a technique 112 for DIR imaging according to an embodiment of the invention. Technique 112 begins at block 114 with the preparation of a DIR sequence according to technique 96. At block 116, an imaging scan is executed to acquire data according to the DIR sequence prepared at block 114. Data acquired during the executed imaging scan is reconstructed into an image at block 118 using known reconstruction techniques. The reconstructed image may be stored for later use or displayed to a user at block 120.

According to embodiments of the invention, minimizing the $T_1$ effects on fluid attenuated imaging may eliminate the desire to have both fluid attenuated and unattenuated $T_2$ weighted images acquired for use in clinical imaging. That is, by reducing or eliminating the $T_1$ contamination as compared with standard FLAIR imaging, embodiments of the invention allow for enhanced FLAIR images to be acquired that reduce the need to acquire additional images that require extra time and cost. In addition, embodiments of the invention incorporate a relatively short TR compared with standard FLAIR. Using DIR according to an embodiments of the invention, high quality fluid attenuated images can be acquired quickly.

A technical contribution for the disclosed method and apparatus is that it provides for a computer implemented system and method for reducing the $T_1$ contribution to FLAIR imaging.

One skilled in the art will appreciate that embodiments of the invention may be interfaced to and controlled by a computer readable storage medium having stored thereon a computer program. The computer readable storage medium includes a plurality of components such as one or more of electronic components, hardware components, and/or computer software components. These components may include one or more computer readable storage media that generally stores instructions such as software, firmware and/or assembly language for performing one or more portions of one or more implementations or embodiments of a sequence. These computer readable storage media are generally non-transitory and/or tangible. Examples of such a computer readable storage medium include a recordable data storage medium of a computer and/or storage device. The computer readable storage media may employ, for example, one or more of a magnetic, electrical, optical, biological, and/or atomic data storage medium. Further, such media may take the form of, for example, floppy disks, magnetic tapes, CD-ROMs, DVD-ROMs, hard disk drives, and/or electronic memory. Other forms of non-transitory and/or tangible computer readable storage media not list may be employed with embodiments of the invention.

A number of such components can be combined or divided in an implementation of a system. Further, such components may include a set and/or series of computer instructions written in or implemented with any of a number of programming languages, as will be appreciated by those skilled in the art. In addition, other forms of computer readable media such as a carrier wave may be employed to embody a computer data signal representing a sequence of instructions that when executed by one or more computers causes the one or more computers to perform one or more portions of one or more implementations or embodiments of a sequence.

Therefore, according to an embodiment of the invention, an MRI apparatus comprises a magnetic resonance imaging (MRI) system having a plurality of gradient coils positioned about a bore of a magnet, and an RF transceiver system and an RF switch controlled by a pulse module to transmit RF signals to an RF coil assembly to acquire MR images. A computer is also included and programmed to prepare a double inversion recovery (DIR) sequence comprising a pair of inversion pulses and an excitation pulse, execute the DIR sequence to acquire MR data from an imaging subject, and reconstruct an image based on the acquired MR data. The preparation of the DIR sequence comprises optimizing a first inversion time ($TI_1$) between the pair of inversion pulses and a second inversion time ($TI_2$) between one of the pair of inversion pulses and the excitation pulse to cause a first tissue of the imaging subject to be suppressed in the image and to reduce a T1 contrast between a second tissue and a third tissue of the imaging subject in the image.

According to another embodiment of the invention, a method of MR imaging comprises preparing a double inversion recovery (DIR) sequence comprising a pair of inversion pulses and an excitation pulse that optimizes a first inversion time ($TI_1$) and a second inversion time ($TI_2$) to cause suppression of MR signals of a first tissue of an imaging subject and to reduce a T1 contrast between MR signals of a second tissue and a third tissue of the imaging subject, wherein $TI_1$ occurs between the inversion pulses of the pair of inversion pulses and wherein $TI_2$ occurs between the pair of inversion pulses and the excitation pulse. The method also includes executing the DIR sequence to acquire MR data from the imaging subject, and reconstructing an image based on the acquired MR data.

According to yet another embodiment of the invention, a computer readable storage medium having stored thereon a computer program comprising instructions, which, when executed by a computer, cause the computer to prepare a double inversion recovery (DIR) sequence comprising a first inversion pulse, a second inversion pulse, and an excitation pulse executable after the first and second pulses, wherein a timing between the first and second pulses and a timing between the second pulse and the excitation pulse cause suppression of a first tissue in an image reconstructed from data acquired from an imaging subject and cause a reduction in a T1 contrast between a second tissue and a third tissue of the imaging subject in the image. The instructions also cause the computer to execute the DIR sequence to acquire MR data from the imaging subject, and reconstruct the image based on the acquired MR data.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An MRI apparatus comprising:
   a magnetic resonance imaging (MRI) system having a plurality of gradient coils positioned about a bore of a magnet, and an RF transceiver system and an RF switch controlled by a pulse module to transmit RF signals to an RF coil assembly to acquire MR images; and
   a computer programmed to:
     prepare a double inversion recovery (DIR) sequence comprising a pair of inversion pulses and an excitation pulse;
     cause the plurality of gradient coils, the RF transceiver system, the RF switch, the pulse module, and the RF coil assembly to execute the DIR sequence and acquire MR data from an imaging subject; and
     reconstruct an image based on the acquired MR data; and
   wherein preparation of the DIR sequence comprises optimizing a first inversion time ($TI_1$) between the pair of inversion pulses and a second inversion time ($TI_2$) between one of the pair of inversion pulses and the excitation pulse to cause a first tissue of the imaging subject to be suppressed in the image and to reduce a T1 contrast between a second tissue and a third tissue of the imaging subject in the image.

2. The MRI apparatus of claim 1 wherein the computer, in being programmed to prepare the DIR sequence, is programmed to express $TI_1$ as a function of $TI_2$.

3. The MRI apparatus of claim 2 wherein the computer, in being programmed to express $TI_1$ as a function of $TI_2$, is programmed to perform the following equation, setting the DIR signal of the tissue to be nulled to zero:

$$TI_1 = T_1 \ln\left(\frac{2}{2e^{-TI_2/T_1} + e^{-(TR-T_{RO})/T_1} - 1}\right) - TI_2,$$

where $T_1$ corresponds to the tissue to be nulled.

4. The MRI apparatus of claim 2 wherein the computer, in being programmed to prepare the DIR sequence, is programmed to determine a range of $TI_2$ values that suppresses the tissue to be nulled.

5. The MRI apparatus of claim 4 wherein the computer, in being programmed to determine the range of $TI_2$ values that suppresses the tissue to be nulled, is programmed to determine one or more pairs of ($TI_1$, $TI_2$) values that null the tissue to be nulled.

6. The MRI apparatus of claim 5 wherein the $TI_2$ values in the one or more pairs of ($TI_1$, $TI_2$) values range from zero to $TI_2^{max}$, There the summation of $TI_1$ and $TI_2$ in each of the one or more pairs of ($TI_1$, $TI_2$) values equals a repetition time (TR) of the DIR sequence.

7. The MRI apparatus of claim 6 wherein the computer s programmed to determine $TI_2^{max}$ using the equation:

$$TI_2^{max} = T_1 \ln\left(\frac{2}{1 + 2e^{-TR/T_1} - e^{-(TR-T_{RO})/T_1}}\right),$$

where $T_1$ corresponds to the tissue to be nulled.

8. The MRI apparatus of claim 5 wherein the computer, in being programmed to prepare the DIR sequence, is programmed to calculate signals (S) for the second and third tissues at an excitation time for each of the one or more pairs of ($TI_1$, $TI_2$) values.

9. The MRI apparatus of claim 8 wherein the computer, in being programmed to calculate signals (S) for the second and third tissues, is programmed to calculate the signals using the following equation:

$$S = M_0\left[1 - 2e^{\frac{-TI_2}{T_1}} + 2e^{\frac{-(TI_1+TI_2)}{T_1}} - e^{\frac{-(TR-T_{RO})}{T_1}}\right] \cdot e^{-TE_{eff}/T_2},$$

where $TE_{eff}$ is the effective echo time, and where $TE_{eff}$ is set equal to zero.

10. The MRI apparatus of claim 8 wherein the computer is programmed to set the $TI_1$ and $TI_2$ values for the DIR sequence to be equal to the pair of ($TI_1$, $TI_2$) values that cause the signals (S) for the second and third tissues to be equal to one another at the excitation time.

11. The MRI apparatus of claim 1 wherein the first tissue comprises cerebrospinal fluid (CSF);
   wherein the second tissue comprises white matter (WM); and
   wherein the third tissue comprises a multiple sclerosis (MS) lesion.

12. A method of MR imaging comprising:
preparing a double inversion recovery (DIR) sequence comprising a pair of inversion pulses and an excitation pulse that optimizes a first inversion time ($TI_1$) and a second inversion time ($TI_2$) to cause suppression of MR signals of a first tissue of an imaging subject and to reduce a T1 contrast between MR signals of a second tissue and a third tissue of the imaging subject, wherein $TI_1$ occurs between the inversion pulses of the pair of inversion pulses and wherein $TI_2$ occurs between the pair of inversion pulses and the excitation pulse;
executing the DIR sequence to acquire MR data from the imaging subject; and
reconstructing an image based on the acquired MR data.

13. The method of MR imaging of claim 12 wherein preparing comprises determining a signal of the second tissue and a signal of the third tissues at a time of the excitation pulse based on a $TI_1$ and $TI_2$ pair that cause the first tissue to be nulled.

14. The method of MR imaging of claim 13 wherein preparing further comprises setting $TI_1$ and $TI_2$ of the DIR sequence equal to the $TI_1$ and $TI_2$ pair if the signals of the second and third tissues are substantially equal.

15. The method of MR imaging of claim 13 wherein preparing further comprises determining a plurality of $TI_1$ and $TI_2$ pairs that cause the first tissue to be nulled.

16. A non-transitory computer readable storage medium having stored thereon a computer program comprising instructions, which, when executed by a computer, cause the computer to:
prepare a double inversion recovery (DIR) sequence comprising a first inversion pulse, a second inversion pulse, and an excitation pulse executable after the first and second pulses, wherein a timing between the first and second pulses and a timing between the second pulse and the excitation pulse cause suppression of a first tissue in an image reconstructed from data acquired from an imaging subject and cause a reduction in a T1 contrast between a second tissue and a third tissue of the imaging subject in the image;
execute the DIR sequence to acquire MR data from the imaging subject; and
reconstruct the image based on the acquired MR data.

17. The non-transitory computer readable storage medium of claim 16 wherein the timing between the first and second pulses comprises a first inversion time, $TI_1$, and wherein the timing between the second pulse and the excitation pulse comprises a second inversion time, $TI_2$.

18. The non-transitory computer readable storage medium of claim 17 wherein the instructions that cause the computer to prepare the DIR sequence cause the computer to determine a pair of values for $TI_1$ and $TI_2$ that cause the first tissue to be suppressed and that cause signals from the second and third tissues to be substantially equal at a time equal to the summation of $TI_1$ and $TI_2$.

19. The non-transitory computer readable storage medium of claim 18 wherein the signals from the second and third tissues are negative.

20. The non-transitory computer readable storage medium of claim 16 wherein the first tissue comprises cerebrospinal fluid (CSF);
wherein the second tissue comprises white matter (WM); and
wherein the third tissue comprises a multiple sclerosis (MS) lesion.

* * * * *

UNITED STATES PATENT AND TRADEMARK OFFICE
CERTIFICATE OF CORRECTION

| | | |
|---|---|---|
| PATENT NO. | : 9,063,206 B2 | Page 1 of 1 |
| APPLICATION NO. | : 13/427394 | |
| DATED | : June 23, 2015 | |
| INVENTOR(S) | : Madhuranthakam et al. | |

It is certified that error appears in the above-identified patent and that said Letters Patent is hereby corrected as shown below:

In the claims

Col. 8, line 30 (Claim 6), delete ", There" and
               substitute therefore -- , where --.

Col. 8, line 33 (Claim 7), delete "computer s" and
               substitute therefore -- computer is --.

Signed and Sealed this
Seventeenth Day of November, 2015

Michelle K. Lee
*Director of the United States Patent and Trademark Office*